United States Patent
Wyse et al.

(10) Patent No.: US 8,614,603 B1
(45) Date of Patent: Dec. 24, 2013

(54) AUTO LEVELING RECEIVER

(75) Inventors: Russell D. Wyse, Center Point, IA (US); Mark A. Willi, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 710 days.

(21) Appl. No.: 12/796,937

(22) Filed: Jun. 9, 2010

(51) Int. Cl.
*H03F 3/45* (2006.01)

(52) U.S. Cl.
USPC ......... 330/261; 330/253; 330/277; 455/234.1

(58) Field of Classification Search
USPC ........... 455/234.1, 232.1, 245.2, 251.1, 253.2
See application file for complete search history.

(56) References Cited

U.S. PATENT DOCUMENTS

| | | |
|---|---|---|
| 5,049,829 A | 9/1991 | Garskamp et al. |
| 5,973,566 A | 10/1999 | Leiby |
| 7,353,010 B1 * | 4/2008 | Zhang et al. ............... 455/234.1 |
| 2003/0185250 A1 | 10/2003 | Harberts et al. |
| 2007/0241821 A1 * | 10/2007 | Dally et al. .................. 330/279 |
| 2008/0048775 A1 | 2/2008 | Wang |
| 2008/0272847 A1 * | 11/2008 | Dally et al. .................. 330/279 |
| 2009/0201090 A1 * | 8/2009 | Dally et al. .................. 330/279 |

* cited by examiner

*Primary Examiner* — Temesgh Ghebretinsae
*Assistant Examiner* — Richard Chan
(74) *Attorney, Agent, or Firm* — Donna P. Suchy; Daniel M. Barbieri

(57) ABSTRACT

An auto leveling circuit suitable for use in an RF receiver. The auto leveling circuit comprises a plurality of automatic gain control (AGC) circuits each having at least one amplifier stage to amplify an RF signal according to at least two incrementally discrete levels. In order to selectively control gain, the AGC circuits further comprise peak detectors to detect the amplitude of the amplified RF signal and comparators to compare the amplitude of the RF signal with a threshold value indicative of a saturation point of the amplifiers.

17 Claims, 6 Drawing Sheets

AUTO LEVELING RECEIVER

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of contract No. FA8650-05-C-7214 awarded by the U.S. Air Force.

BACKGROUND

The invention relates to RF communications and more specifically to an apparatus for controlling the amplification of an analog signal in the front end of a digital receiver and a method of use in RF equipment.

RF communication equipment generally employ amplifiers to increase analog signal levels before being digitally processed. This helps to distinguish weak signals from noise. Too much amplification, however, can adversely affect the receiver. For example, unnecessarily amplifying a strong signal may induce distortion, and possibly overload or damage certain components (e.g. saturating analog-to-digital converters (ADCs)) of a digital receiver.

SUMMARY OF THE INVENTION

According to the present invention, there is provided an auto leveling circuit suitable for use in an RF receiver. The auto leveling circuit comprises a plurality of automatic gain control (AGC) circuits each being an amplifier stage to amplify an RF signal according to at least two incrementally discrete levels. In order to control the amplification level, the AGC circuit further comprises peak detectors to detect the amplitude of the amplified RF signal and comparators to compare the amplitude of the RF signal with a threshold value indicative of a saturation point of the amplifiers.

In an embodiment, a plurality of AGC circuits are ganged together in series. Each AGC circuit provides two or more discrete levels with which to incrementally increase or decrease the level of the RF signal in discrete gain steps. When AGC acts as an attenuator, the gain levels are suppressed when they approach a saturation region of operation and the gain decreases by a discrete step. Alternatively, when AGC acts as an amplifier, a subsequent gain level is engaged when the previous gain level enters a margin before its saturation region, thereby increasing the output signal by a discrete step. This process continues in successive AGC stages, until the desired signal strength is achieved.

In another embodiment, a method of detecting an RF signal is disclosed. An RF signal is received from an antenna (or other source) at an input of an AGC having two or more incrementally discrete gain levels. The AGC determines the peak amplitude of the RF signal and compares it with a reference. If the peak amplitude of the RF signal is greater than the reference, the gain of the respective discrete gain level is suppressed and the subsequent gain level is decreased by a discrete step. The method disclosed provides an amplified RF output signal with constant phase relationship to the RF input signal across all gain settings.

These and other aspects, features, and advantages of the invention will become apparent upon review of the following description taken in connection with the accompanying drawings. The invention, though, is pointed out with particularity by the appended claims.

DETAILED DESCRIPTION OF THE INVENTION

Figure 1:
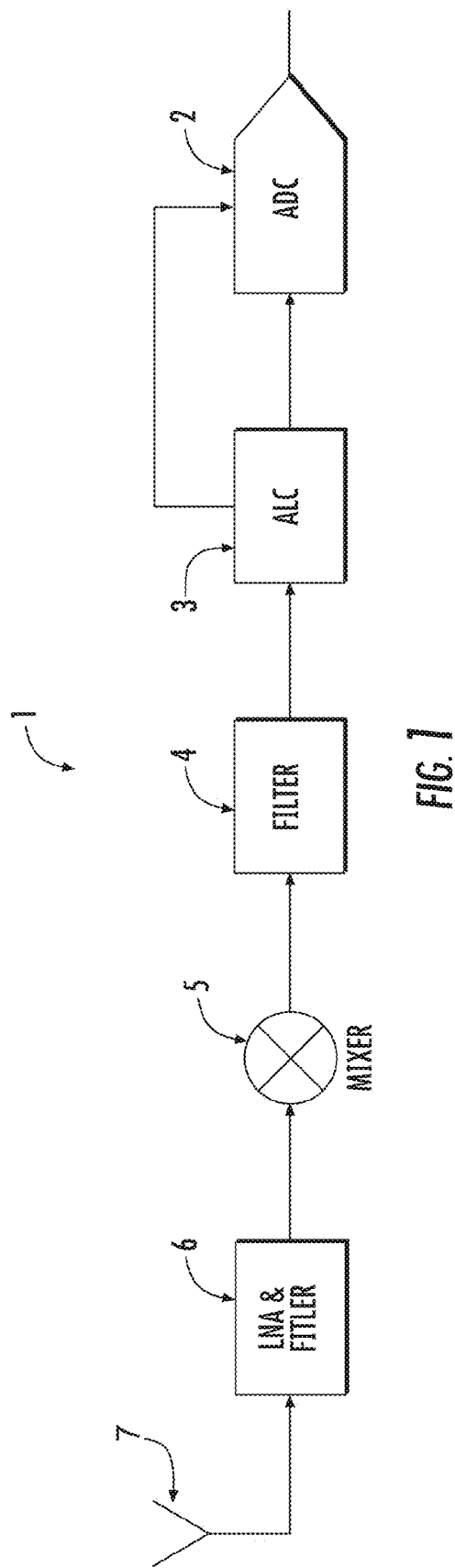
FIG. 1 is a system block diagram of a portion of a signal processing system in accordance with the present invention.

In FIG. 1, an automatic leveling circuit (ALC) 3 operable in an analog portion or front end of a digital receiver quickly senses signal strength at an antenna 7 input over a large dynamic frequency range and adjusts signal strength to an optimal level for digital processing. Automatic scaling or leveling employed by the present invention also speeds up digital processing of the received RF analog signal in an analog-to-digital converter (ADC) 2 by reducing the number of bits the ADC 2 requires to process the signal, while maintaining the accuracy in the conversion process. Any communication device such as an RF transmitter-receiver of a mobile phone, a personal communications service (PCS) phone, a wireless local area network (LAN) transmitter-receiver, etc may incorporate the ALC 3.

Still referring to FIG. 1, receiver 1, in accordance with an embodiment of the invention, includes a low noise amplifier (LNA) and filter 6 to receive an incoming RF signal from an antenna 7 and to provide an initial amplified RF signal. Mixer 5 converts the amplified RF signal to an intermediate frequency (IF) signal before filter 4 removes unwanted components of the intermediate signal. Automatic leveling circuit 3 amplifies the intermediate signal to an optimum level for signal processing by ADC 2. One skilled in the art will recognize that the above is only a small part of a device and that there are a multitude of signal processing functions possible depending upon the specific use of the receiver 1.

Figure 2:
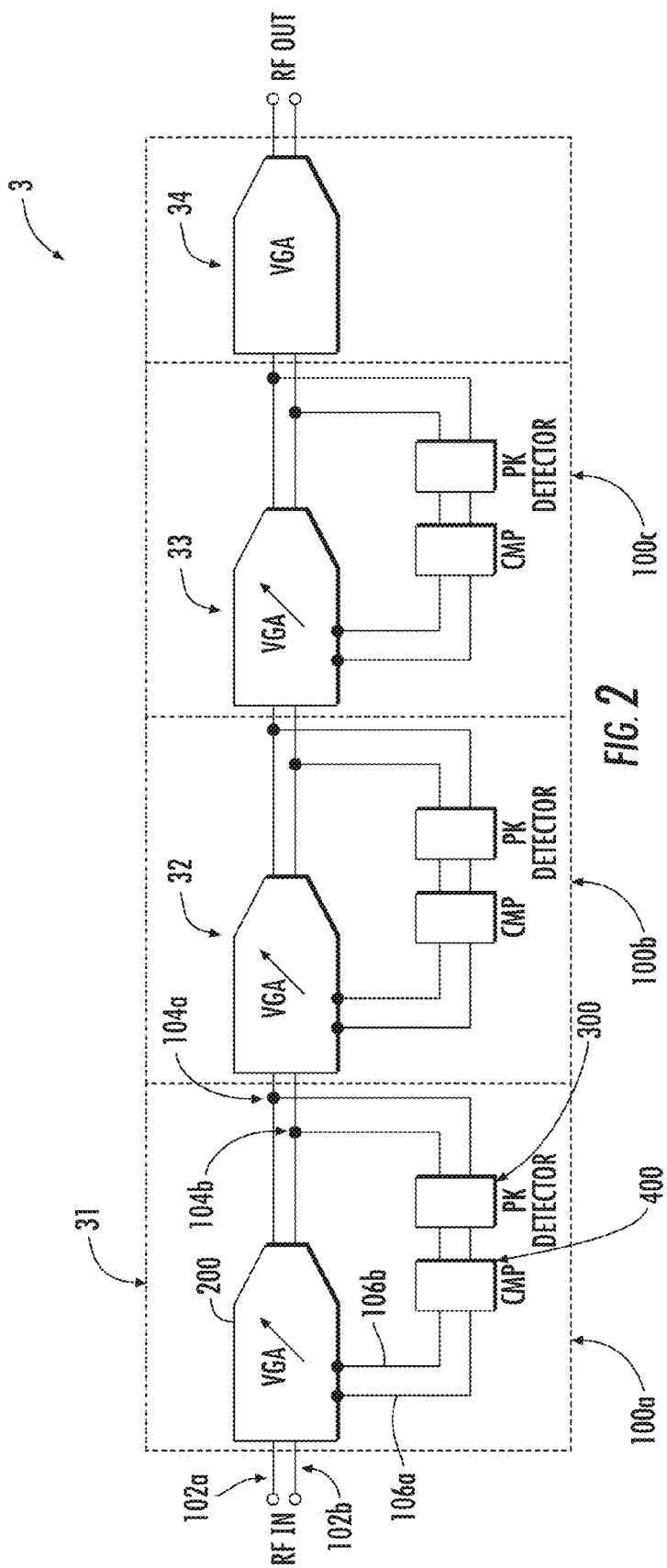
FIG. 2 is a schematic diagram of an automatic leveling circuit in accordance with the present invention.

FIG. 2 illustrates details of an exemplary ALC 3 where an automatic gain control (AGC) circuit 100, in order to desirably scale the analog RF signal, amplifies signal in accordance with one or more predetermined discrete gain settings. AGC 100 includes a variable gain amplifier (VGA) 200 to amplify the analog RF signal by one or more predetermined discrete gain steps. Peak detector 300 (abbreviated PK Detector in FIG. 2) detects the amplitude of the analog signal and provides its output to a comparator 400 (abbreviated CMP in FIG. 2). Comparator 400 compares peak voltage of the analog signal with a threshold value indicative of a pre-saturation point for VGA 200. Since, comparator 400 generates a digital output indicative of a "0" or "1" digit, VGA 200 knows whether its output is saturated by receipt of a digital representation of a discrete yes/no or on/off signal representation. In the illustFative embodiment, receiver 1 is implemented as an integrated circuit in a fully differential cascaded architecture that provides immunity to noise from digital circuitry of the receiver 1.

Exemplary ALC 3 comprises three AGCs 100a, 100b, and 100c wherein each AGC provides a respective amplifier stage, 31, 32, and 33. First amplifier stage 31 provides three discrete gain levels and two adjustable on/off steps. Second amplifier stage 32 provides three discrete gain levels and two adjustable on/off steps. Since the output of second amplifier stage 32 is large, only two discrete gain levels and one adjustable on/off step are provided in third amplifier stage 33. Final stage 34 buffers the output power of the output signal for receipt by A/D 2.

Figure 3:
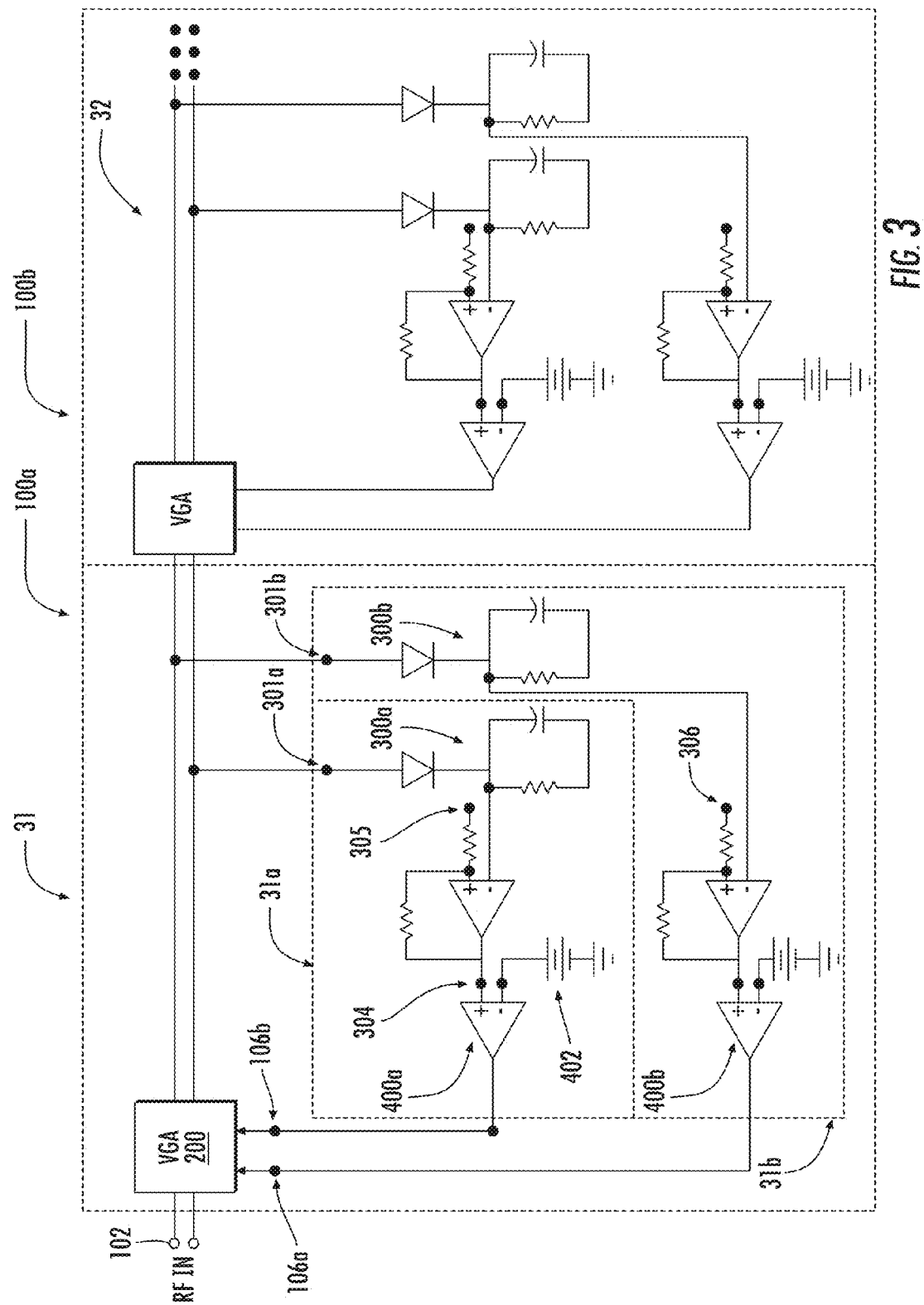
FIG. 3 is circuit diagram of a portion of an automatic leveling circuit detailing an automatic gain control feature of the present invention.

FIG. 3 exemplifies a circuit diagram having two AGCs 100a, 100b ganged together and representing first two amplifier stages 31 and 32. VGA 200 has a differential RF input 102a, 102b and a differential RF output 104a, 104b and a differential control node 106a, 106b. VGA's 200 differential output node 104a, 104b is coupled to differential input 301a, 301b of peak detector 300a, 300b. At this point, the differential signals on differential output 104a, 104b are separated into two discrete levels 31a and 31b.

Differential output signals of VGA 200 are received by peak detector 300a, 300b, each of which outputs a signal representative of the peak voltage amplitude of the output signal of VGA 200. The peak voltage amplitude at each discrete level 31a, 31b is compared to respective first and second reference voltages applied at nodes 305 and 306, respectively, which values indicate the maximum linear output for VGA 200 at that respective discrete level 31a, 31b. As the RF output signal of VGA 200 approaches its saturation point, comparators 400a, 400b send a signal to nodes 106a, 106b of VGA 200 to suppress the gain. One skilled in the art will recognize that the above is only one way to attenuate gain in response to VGA saturation and that there are a multitude of circuit arrangements that may be used depending upon the design requirements.

In one embodiment of the invention, a plurality of AGCs 100 are ganged together in series to create a plurality of amplifier stages 31, 32, and 33, respectively. A circuit designer, however, may combine any number of AGCs to amplify the output signal to any desired level. Such an arrangement advantageously allows automatic leveling circuit 3 to sense the strength of the output signal and increases it by predetermined discrete amounts until obtaining a desired output signal strength.

Figure 6:
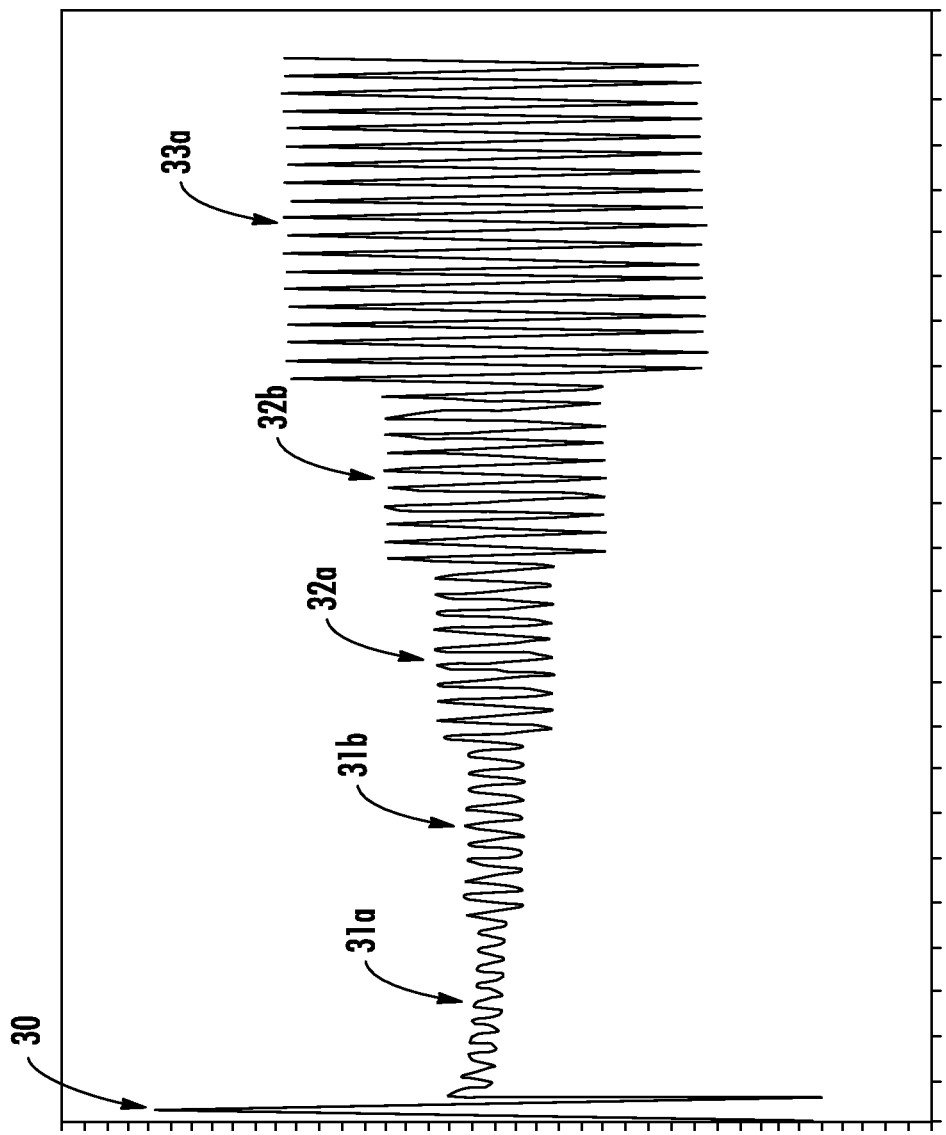
FIG. 6 shows the output signal of the auto leveling circuit being increased in discrete gain steps.

FIG. 6 shows the output of the automatic leveling circuit having five discrete gain levels, representative of gain stages 31 and 32 each having two discrete levels, 31a, 31b, 32a, and 32b, respectively, and amplifier stage 33 having one discrete level 33a. Discrete gain levels 31a, 31b, 32a, 32b, and 33a increase the output by incremental amounts until obtaining the desired output signal strength.

FIG. 6 also illustrates attenuation of the output in response to VGA approaching saturation. The brief voltage spike 30 illustrates the ALR adjusting the gain when multiple gain stages of VGAs 200 saturate. After reducing or terminating the gain of VGAs 200 in response to the signal spike 30, the output signal level is increased by the predetermined discrete levels 31a, 31b, 32a, 32b, and 33a until attaining the desired signal strength.

VGA 200 in AGC 100 makes possible the amplification of the output signal in discrete, fast, predetermined gain steps.

Figure 4:
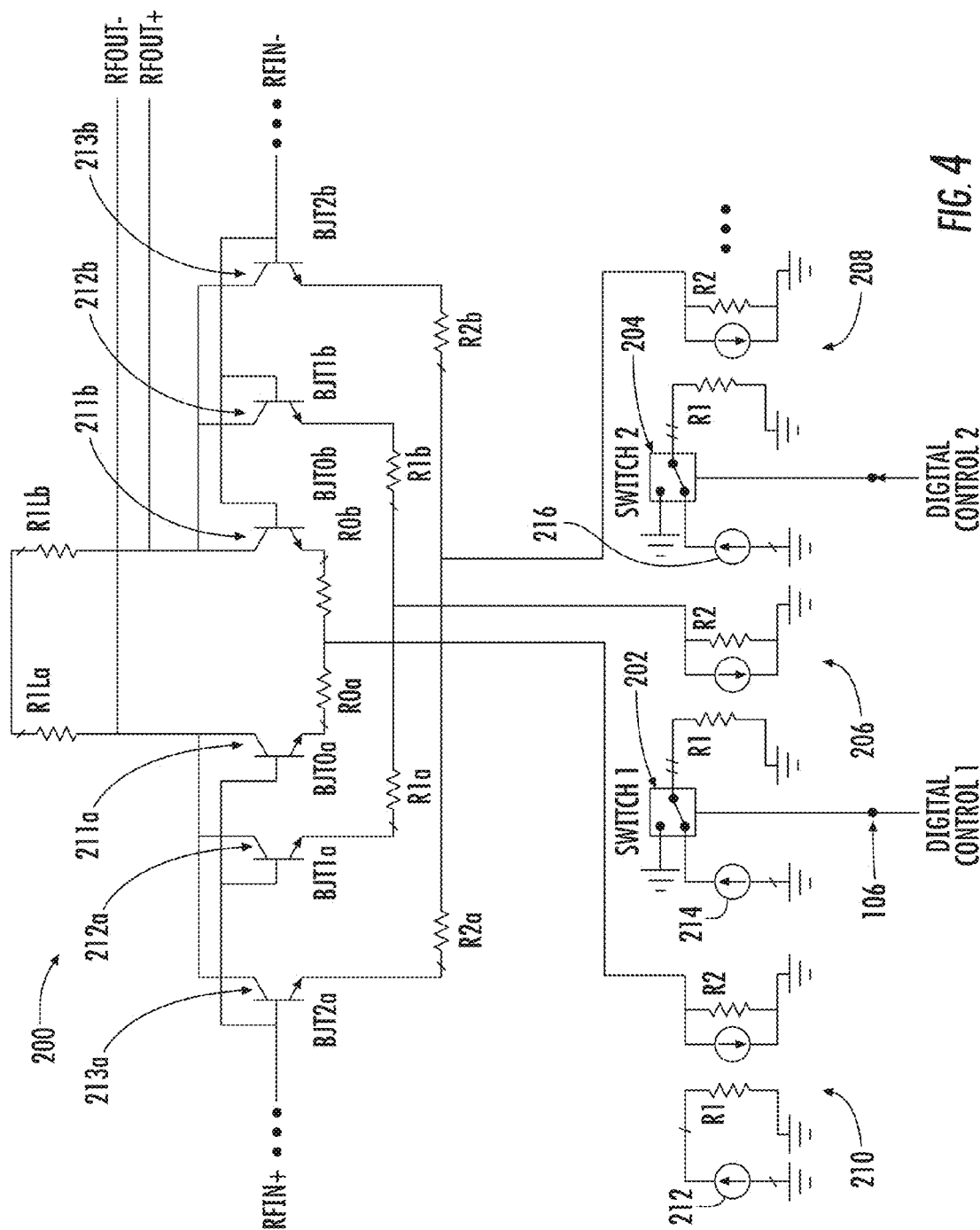
FIG. 4 is a circuit diagram of an exemplary variable gain amplifier in accordance with the present invention.

FIG. 4 shows an embodiment of VGA 200 with three discrete gain levels controlled by bias sources 206, 208, and 210, with bias sources 206 and 208 having adjustable on/off steps. As illustrated, VGA circuit 200 receives a digital input at control nodes 106a, 106b. The digital input controls two of three discrete bias sources 206 and 208 of VGA, 200 which results in discrete gain states. The output signal of VGA 200 may suffer amplitude attenuatation and phase distortion as the VGA 200 approaches saturation; however, suppressing one or both control nodes 106a, 106b mitigates this effect by reducing the output by one or more predetermined discrete gain steps.

Alternatively, VGA 200 may work as an amplifier by incrementally increasing the output signal by predetermined discrete gain steps. When there is sufficient headroom available for the output signal to be amplified, differential transistor pair 212 is turned on to increase the output signal by a predetermined discrete gain step. If there is still sufficient headroom available for the output signal to be amplified again, differential transistor pair 213 can be switched on to increase the output signal by another predetermined discrete gain step. At this point, the output is at the desired level. Alternatively, if more gain is required, the circuit designer may gang together additional VGAs 200.

VGA 200 has three discrete gain levels controlled by bias sources 206, 208, and 210, with bias sources 206 and 208 having adjustable on/off steps. The three discrete gain levels each comprises a differential transistor pair, where differential transistor pair 211 is always on and differential transistor pairs 212 and 213 can be turned off. Differential transistor pairs 212 and 213 are turned on and off by their respective bias source 206 and 208. The gain settings for differential transistor pairs 211, 212, and 213 are primarily determined by the ratio of the emitter resistors to the collector resistors R1La/R0, R1 La/R1, and R1 La/R2, respectively, when the differential transistor pairs 212, and 213 are biased on. The gain steps occur when the transconductance of the adjustable gain stages, comprising differential transistor pairs 212, and 213, is suppressed by turning off their respective bias source 206, 208. Because the circuit designer may control the value of the ratio of the emitter resistors to the collector resistors the output signal of AGC 100 is adjustable by predetermined discrete gain steps. One skilled in the art will recognize that the above description of VGA 200 is only one embodiment and any number of gain stages could be provided to meet the designers needs.

In an alternative embodiment, the VGA may comprise any other type of transistor arrangement, such as FET, MOS, CMOS, Bi-CMOS, HBY, MES-FET, or HEMT type transistors, so long as the desired effect is obtained.

The present invention is further operable as a method for operating an RF radio. In FIG. 3, AGC 100 receives an input RF signal and provides an amplified output RF signal. The peak voltage amplitude of the output signal is determined by peak detectors 300a, 300b and compared to a reference value 305 and 306, which reference value is indicative of the saturation point of VGA 200. If the peak amplitude of the output signal is less than the saturation point, VGA 200 will amplify the output signal by another predetermined discrete value and continue to do so, until obtaining the desired signal strength for the output signal. Alternatively, if the output signal is greater than the reference, VGA 200 will shut off the gain.

The arrangement provided within in the illustrated RF circuitry creates an auto-leveling receiver 1 that increases the analog signal in the analog portion of the receiver 1 by discrete predetermined gain steps until achieving the desired signal strength. Because the gain in each stage 31, 32, and 33 is known, it is possible for ADC 2 to receive information about the input RF signal before ADC 2 processes the output from the automatic leveling circuit 3. Accordingly, ADC 2 digitally processes the RF signal by sampling fewer bits and without losing information contained in the signal.

Figure 5:
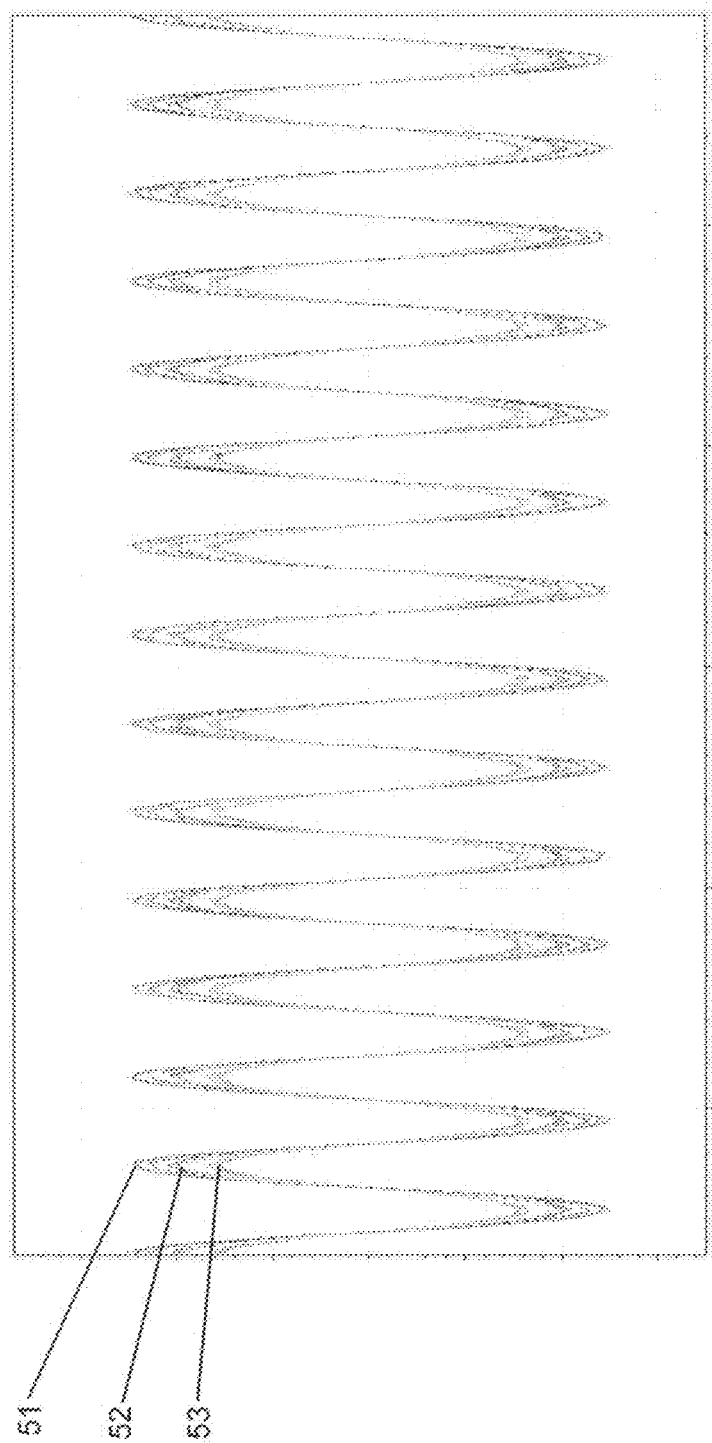
FIG. 5 illustrates phase linearity of an amplified output signal across several amplitude levels of the auto leveling circuit of the present invention.

The time required for auto-leveling receiver 1 to optimize the signal level is a function of VGAs 200 ability to rapidly adjust its gain. The faster VGA 200 can adjust its gain the faster auto-leveling receiver 1 can converge on the desired signal level. The transition between gain steps in VGAs 200 occurs rapidly. In the illustrative embodiment, the transition occurs in approximately one nanosecond. Operating VGAs 200 gain stages out of saturation maintains a constant phase relationships across all gain settings. This is crucial for signal processing systems where the phase of the signal carries the information. FIG. 5 illustrates linearity in phase of the output signal across all gain settings as the input signal level is swept across a 55 dB dynamic range, advantageously showing a constant phase relationship across all amplitude levels 51, 52, and 53.

While the present invention has been particularly shown and described with reference to exemplary embodiments, it should be understood by those of skill in the art that various changes, substitutions and alterations can be made herein without departing from the scope of the invention as defined by appended claims and their equivalents.

We claim:

1. An RF radio comprising:
an automatic gain control (AGC) circuit having an input node to receive an RF signal and an output node that provides a gain-controlled RF signal, the AGC circuit further comprising:
an amplifier stage to amplify the RF signal according to at least two incrementally discrete levels, wherein the amplifier stage has an input that couples the input node of the AGC and an output that couples the output node of the AGC, wherein each discrete level of the amplifier stage includes at least two separate differential transistor pairs, a collector resistor load connected to the at least two separate differential transistor pairs, a first emitter resistor load connected to a first of the at least two separate differential transistor pairs, and a second emitter resistor load connected to the a second of the at least two separate differential transistor pairs, wherein a gain of the discrete level is based on a ratio of the collector resistor load to one chosen from the first emitter resistor load and the second emitter resistor load;
a peak detector to detect an amplitude of the RF signal; and
a comparator responsive to the peak detector to compare the amplitude of the RF signal with a reference in order to provide a control signal to a control node of the amplifier to activate a respective one of the discrete levels according to the amplitude of the RF signal.

2. The RF radio of claim 1, and further comprising a plurality of AGC circuits ganged together and forming a plurality of amplifier stages.

3. The RF radio of claim 2, wherein the gain of the amplifier stages in at least one of the plurality of AGC circuits is disabled when one of the amplifier stages enters a saturation region of operation.

4. The RF radio of claim 3, wherein the plurality of AGC circuits are adapted to maintain a constant phase relationship across gain settings between the input node and the output node.

5. The RF radio of claim 4, and further comprising a final amplifier stage AGC circuit, to modify an output power level of the RF signal.

6. The RF radio of claim 1, wherein the AGC circuit further comprises differential amplifiers.

7. The RF radio of claim 6, the AGC circuit further comprises a plurality of differential amplifier circuits that are ganged together to form a plurality of amplifier stages.

8. The RF radio of claim 7, wherein a first AGC circuit of the plurality of AGC circuits is an input amplifier stage adapted to selectively incrementally modify an input signal by one of three discrete values.

9. The RF radio of claim 8, wherein a second AGC circuit of the plurality of AGC circuits is a second amplifier stage adapted to selectively incrementally modify an input signal by one of three discrete values, wherein the three discrete values in the second amplifier stage are less than the three discrete values in the input amplifier stage.

10. The RF radio of claim 9, and further comprising a third AGC circuit, wherein the third AGC circuit is a third amplifier stage adapted to selectively incrementally modify an input signal by one of two discrete values, wherein the two discrete values in the third amplifier stage are less that the three discrete values in the second amplifier stage.

11. The RF radio of claim 10, and further comprising a final amplifier stage, wherein the final amplifier stage modifies an output power level for the plurality of amplifier stages.

12. A method of detecting an RF signal, comprising:
receiving the RF signal at an input of an Automatic Gain Control (AGC) circuit;
providing at least two incrementally discrete gain levels within the AGC circuit, wherein the at least two incrementally discrete gain levels include at least two separate differential transistor pairs, a collector resistor load connected to the at least two separate differential transistor pairs, a first emitter resistor load connected to a first of the at least two separate differential transistor pairs, and a second emitter resistor load connected to a second of the at least two separate differential transistor pairs, wherein a gain of the discrete level is based on a ratio of the collector resistor load to one chosen from the first emitter resistor load and the second emitter resistor load,
determining a peak amplitude of the RF signal;
comparing the peak amplitude with a reference;
activating one of the at least two discrete gain levels of the AGC circuit in response to the comparing step to amplify the RF signal; and
providing an AGC output signal with substantially a same phase relationship with the RF signal.

13. The method of claim 12, wherein determining the peak amplitude, includes detecting the RF signal with a peak detector.

14. The method of claim 12, and further comprising disabling a respective discrete gain level in response to saturation thereof.

15. An apparatus to provide automatic leveling of an RF signal detected by a receiver, the apparatus comprising:
at least two amplifier stages to amplify an RF signal according to one of at least two discrete gain settings, wherein each amplifier stage has an input and an output, and a control node, wherein the at least two amplifier stages each further comprise at least two separate differential transistor pairs, a collector resistor load connected to the at least two separate differential transistor pairs, a first emitter resistor load connected to a first of the at least two separate differential transistor pairs, and a second emitter resistor load connected to a second of the at least two separate differential transistor pairs, wherein each of the at least two discrete gain settings is based on a ratio of the collector resistor load to one chosen from the first emitter resistor load and the second emitter resistor load;
a peak detector to detect an amplitude of the RF signal; and
a comparator responsive to the peak detector to compare the amplitude of the RF signal with a reference in order to provide a respective control signal to the control node that activates a respective one of the at least two discrete gain settings according to the amplitude of the RF signal.

16. The apparatus of claim 15, wherein the at least two amplifier stages, the peak detector, and comparators comprise differential amplifiers.

17. The apparatus of claim 16, and further comprising a plurality of variable gain amplifiers, peak detectors, and comparators connected in series wherein an output of each of the at least two amplifier stages represents an output of an amplifier stage, and wherein each amplifier stage amplifies an analog signal by an amount greater than a preceding amplifier stage.

* * * * *